United States Patent [19]
Johnson

[11] Patent Number: 4,658,253
[45] Date of Patent: Apr. 14, 1987

[54] INTERNALLY SYNCHRONOUS MATRIX STRUCTURE FOR USE IN EXTERNALLY ASYNCHRONOUS PROGRAMMABLE DEVICES

[75] Inventor: Timothy J. Johnson, Palm Bay, Fla.

[73] Assignee: Harris Corporation, Melbourne, Fla.

[21] Appl. No.: 786,701

[22] Filed: Oct. 9, 1985

[51] Int. Cl.$^4$ .................. H04Q 1/00; G06F 7/38; H03K 19/173

[52] U.S. Cl. .................. 340/825.83; 340/825.84; 340/825.9; 307/465

[58] Field of Search .................. 340/825.79, 825.80, 340/825.83, 825.84, 825.85, 825.87, 825.89, 825.9, 825.91; 307/465, 468, 247 A, 480; 365/203, 226

[56] References Cited

U.S. PATENT DOCUMENTS 4,577,190 3/1986 Law .................. 340/825.91

Primary Examiner—Ulysses Weldon
Assistant Examiner—Ralph E. Smith
Attorney, Agent, or Firm—Antonelli, Terry & Wands

[57] ABSTRACT

The speed of operation of a programmable logic device which contains internally synchronous circuit structure is increased by an improved architecture which does not require a power-up transition cycle. Synchronous operation is carried out only for one transition. In each column of the matrix of programmable cells, the rows of which are coupled to receive the logic signals upon which the device is to operate, the programmable cells of that column are coupled via a respective inverter feedback pair to a column output link of the matrix. The connection between the programmable cells of the matrix and the inverter feedback pairs are coupled to pull-down switch devices control input of which are coupled to the output of an OR tie, inputs or which depend upon a prescribed transition on row input links. This transition is detected by respective transition detectors which trigger only on a particular transition edge. When the row inputs to the matrix change state, the column outputs follow the transitions asynchronously, with the only delay being that imparted by the inherent delay through the inverter feedback pairs. When the row inputs switch or transition to the opposite state, the transition detector of each row provides an output which, through the OR tie, triggers the pull-down switches. These pull-down switches are capable of overriding the feedback inverter pair to force the column low if it had previously been high and if no other row is holding the column high. For this transition, the matrix operates synchronously.

12 Claims, 2 Drawing Figures

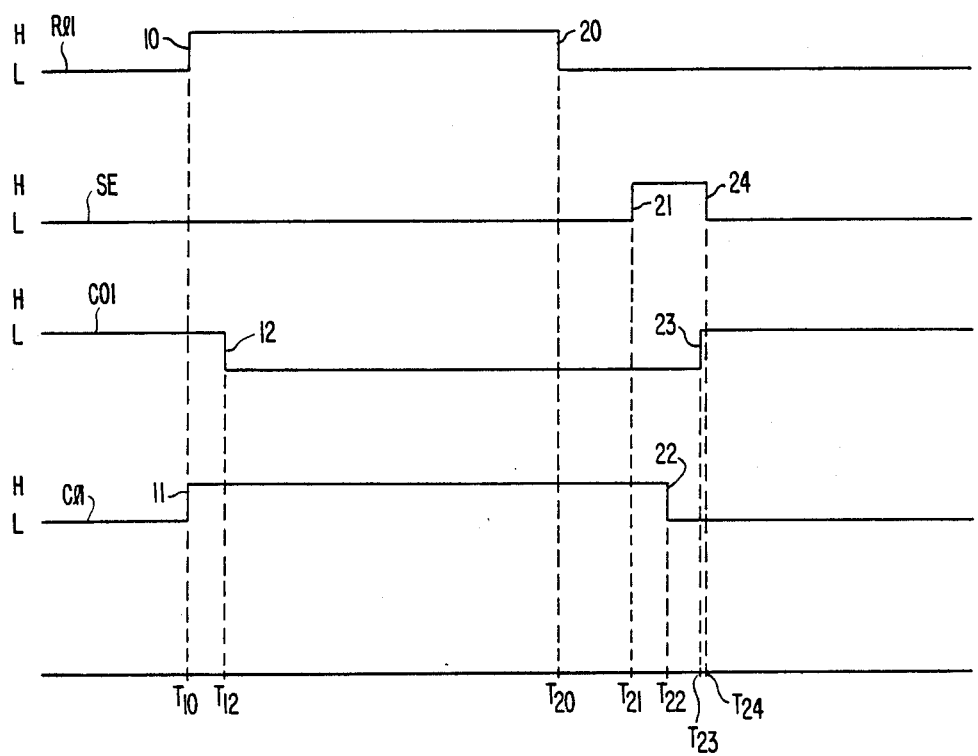

INTERNALLY SYNCHRONOUS MATRIX STRUCTURE FOR USE IN EXTERNALLY ASYNCHRONOUS PROGRAMMABLE DEVICES

FIELD OF THE INVENTION

The present invention relates to programmable logic devices, and is particularly directed to a scheme for increasing the speed of operation of such a device employing an internally synchronous matrix structure.

BACKGROUND OF THE INVENTION

Programmable logic devices which do not employ buffer registers are inherently asynchronous as viewed from external interface terminals. In order to make use of very low power (CMOS) devices, it is necessary that the internal circuitry structure of the programmable logic be synchronous.

One approach for providing synchronous operation has been to employ a chip enable control signal for both powering up the device prior to the matrix performing its logic function and for powering down the device after the matrix has finished performing its logic function. For programmable devices which employ bipolar transistors as the logic elements of the matrix, a forward bias is applied to the bipolar transistors in the power-down mode and, where appropriate, the devices are forward-biased in the power-up mode. Disadvantageously, however, the incorporation of a power transition cycle both prior to and subsequent to the operation of the matrix introduces a time delay which necessarily slows down the performance of the device.

SUMMARY OF THE INVENTION

In accordance with the present invention, the speed of operation of a programmable logic device which contains internally synchronous circuit structure is increased (the synchronous time delay is effectively halved) by an improved architecture which does not require a power-up transition cycle. Synchronous operation (through a chip enable control signal) is carried out only for one transition.

For this purpose, in each column of the matrix of programmable logic, the rows of which are coupled to receive the logic signals upon which the device is to operate, the programmable cells of that column are coupled via a respective inverter feedback pair to a column output link of the matrix. The connection between the programmable cells of the matrix and the inverter feedback pairs are coupled to pull-down switch devices (field effect transistors) control (gate) inputs of which are coupled to the output of an OR tie, inputs of which depend upon a prescribed transition on row input links. This transition is detected by respective transition detectors which trigger only on a particular transition edge (e.g. negative going edge for NPN transistor matrix cells).

With this configuration, when the row inputs to the matrix change state, the column outputs follow the transitions asynchronously, with the only delay being that imparted by the inherent delay through the inverter feedback pairs. When a row input switches or transitions to the opposite state, the transition detector therein provides an output which, through the OR tie, triggers the pull-down switches. Each pull-down switch is capable of overriding the feedback inverter pair to force the column low if it had previously been high and if no other row is holding the column high. For this transition, the matrix operates synchronously.

By eliminating the need for a pull-down element for the positive going edge, the speed of operation of the matrix is increased. When employed in a programmable logic array structure in which two matrices are combined to complement one another (for example an OR-NOR circuit, AND-OR, NOR-NOR circuit) the effect is to increase the speed of the operation of the matrix for both transitions.

BRIEF DESCRIPTION OF THE DRAWINGS

FIG. 2 is a logic state timing diagram associated with the architecture of FIG. 1.

DETAILED DESCRIPTION

Figure 1:
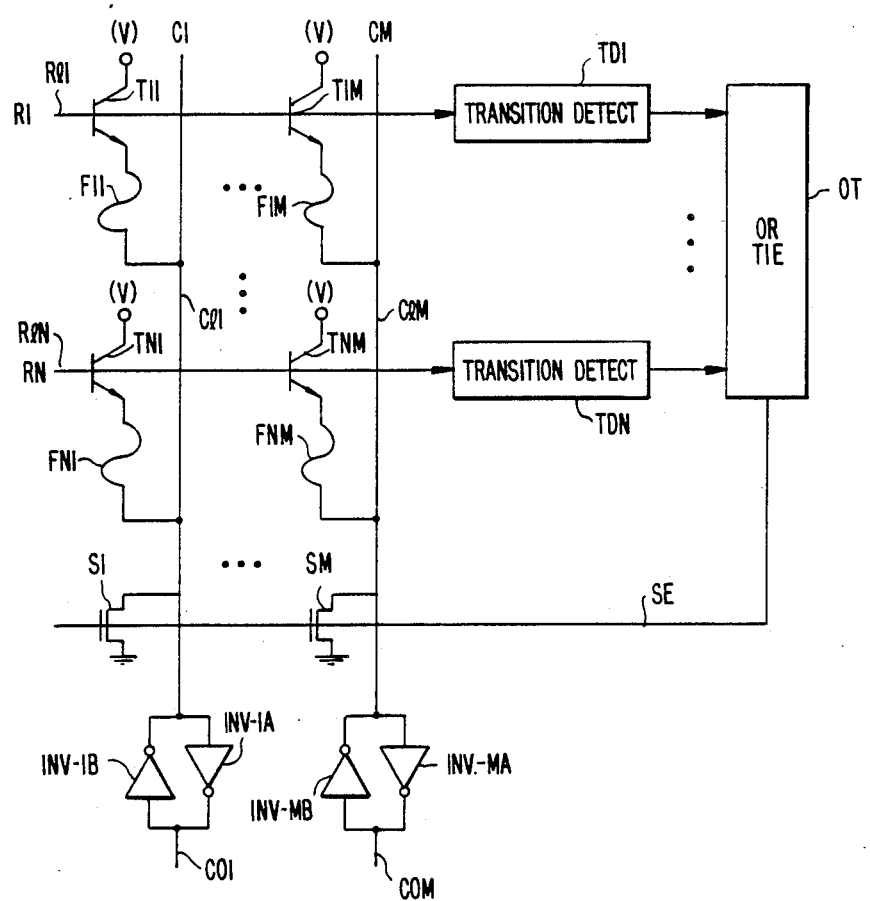
FIG. 1 is a schematic diagram of an internally synchronous programmable logic matrix architecture.

Referring now to FIG. 1, there is shown in improved synchronous programmable logic matrix architecture in accordance with the programmable invention. The matrix itself is comprised of a plurality of rows R1 . . . Rn and columns C1 . . . Cm of programmable logic cells, each of which comprises a bipolar transistor $T_{ij}$ and associated fuse element $F_{ij}$. The logic function executed by the matrix is defined by programming each logic cell (selectively blowing its fuse.) In the matrix structure of FIG. 1, only two rows and two columns are shown in order to simplify the drawing.

In each respective row/column programmable cell, an individual bipolar transistor $T_{ij}$ has its base connected to the row input link $Rl_i$, its collector connected to a power supply terminal (V) and its emitter connected through a respective fuse element $F_{ij}$ to a column link $Cl_j$. Thus, for example, for row 1, column 1, transistor T11 has its base connected to row input link R1, its collector connected to power supply terminal (V), and its emitter connected through fuse element F11 to column link Cl1.

Each of the column links Cl1 . . . Clm is connected through a respective inverter feedback pair to column output link $Co_j$. Thus, column link Cl1 is connected via back-to-back inverters Inv-1A and Inv-1B to column output link Co1, while column link Clm is connected via the inverters Inv-Ma and Inv-Mb of the inverter feedback pair for column link Clm to column output link Com. The inverter feedback pairs are employed for DC power stabilization control, as will be explained in more detail below.

Each of column links Cl1 . . . Clm is also connected to a respective one of pull-down switches S1 . . . Sm, which, as shown in FIG. 1, comprise N-channel field effect transistors, the source drain paths of which are respectively connected between a respective column link $Cl_j$ and a reference potential terminal (here ground). The gate electrode of each of the field effect transistors S1 . . . Sm is coupled via a switch enable link SE to the output of an OR tie circuit OT. The inputs of the OR tie circuit are coupled from respective transition detectors TD1 . . . TDn, the inputs of which are coupled to row links Rl1 . . . Rln. Each of transition detectors $TD_i$ triggers only on the negative going edge for the NPN transistors $T_{ij}$. Where opposite polarity devices are employed, the transition detectors trigger on the opposite edge. Similarly, for opposite polarity devices, it is to be observed that pull-down transistors S1 . . . Sm effectively correspond to pull-up P channel transistors.

Referring now to FIG. 2, the operation of the matrix architecture of FIG. 1 will be explained for a respective logic cell, such as the cell at the intersection of row 1, column 1. It will be initially assumed that the fuse F11 coupled between the emitter of transistor T11 and column link Cl1 has not been blown, so that there is an ohmic connection from the emitter of transistor T11 to column link Cl1. When the state of row input link Rl1 goes from a low state to a high state at time T10, as shown in FIG. 2, transistors T11 (and all transistors coupled to row input link Rl1 which have fuses intact between their emitters and the respective columns) will pull up, causing column link Cl1 to go from a low state to a high state, as shown. Bipolar transistor T11 is strong enough to overcome the feedback inverter pair Inv-1A and Inv-1B where the state of the column was being held low, but to otherwise pull the column high. Thus, the transition on column link Cl1, at this time, is entirely asynchronous, effectively tracking the transition on the row input line Rl1. Thereafter, following a time delay inherent in its internal circuitry, inverter Inv-1A changes state, causing column output link Col to go from a high state to a low state at time T12. From the above operation, it can be seen that for a low-to-high transition, there is no need for a separate power-up cycle due to the DC power stabilization control provided by feedback inverter pairs Inv-1A and Inv-1B. This effectively speeds-up the operation of the matrix, whereby the only delay seen by the output line Col is that inherent in the operation of the inverter Inv-1a.

When a row input link of the matrix goes from a high state to a low state, as shown at transition T20 in FIG. 2, the bipolar transistors which are connected to that row input link are turned off. The associated transition detector TDi for that row triggers on the negative going edge and, after a prescribed internal delay, generates a short pulse (shown in FIG. 2 as having a rising edge 21 and trailing edge 24) which is coupled through OR tie OT and supplied to link SE. Since all of the transition detector outputs are ORed together via the OR tie, the detection pulse on link SE is employed to turn on each of the N-channel pull-down transistors S1 . . . Sm. With the drain of each transistor being connected to a respective column link Cli, and the source being connected to a reference potential (ground), the application of the switch enable signal on link SE pulls down each of links Cl1 . . . ClM at time $T_{22}$ as shown in FIG. 2. The delay between time $T_{21}$ at the positive going edge of the pulse on switch enable link SE and the negative going transition 22 on the column link is due to the inherent delay of the switching transistor Si. Because each of switching transistors S1 . . . Sm is capable of overriding its associated feedback inverter pair, it forces its column link Cli low if it had previously been high and if no other row is holding it high. Since each column is thereby triggered by the same signal on switch enable link SE, for the negative going transition, the matrix operates synchronously. The output column links Coi go high as shown by transition 23 at time T23 subsequent to time T22 due to the inherent delay time of the switching of the inverters feedback pairs.

In FIG. 2, the transition of the pulse produced from the OR tie OT at T24 is shown as occurring subsequent to the positive-going transition on the column link Coi. The time of occurrence of this negative-going pulse is not critical as long as the pulse is wide enough to accommodate the switching of the N-channel transistors S1 . . . Sm, taking into account the inherent delay time of these transistors. Preferably the time of occurrence of the negative going transition T24 produced by the transition detector circuits TDi is subsequent to time T23 at which the output columns change from a low to a high state, thereby eliminating the possibility of a metastable condition.

As will be appreciated from the foregoing description, the internally synchronous matrix architecture of the present invention effectively eliminates the need for a separate power up-cycle for one of the two logic state transitions of the matrix, thereby substantially enhancing the speed of operation of the matrix. The synchronous nature of the matrix is retained by incorporating a transition detector which is OR-tied to pull-down switches of each of the columns.

When multiple matrices are employed in a programmable logic array architecture, the reduction in power-up cycle times augments the speed of the combined structure. Thus, for a complementary logic circuit structure, such as a programmable logic array containing OR-NOR circuits to implement an AND-OR function, the speed of operation of the resulting architecture is increased on both logic state transitions.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. For use with a programmable logic device containing a plurality of programmable logic circuits arranged in rows and columns of a matrix, the logic response of each logic circuit in a respective row of the matrix being accessible by an input signal coupled to a row input link to which each logic circuit of said respective row is coupled, the logic response being coupled to a column output link to which the respective logic circuit is coupled, an arrangement for controlling the operation of said logic device comprising:

first means, coupled to the logic devices and column output links of each column of said matrix, for maintaining the logic states of said column output links in the absence of a transistion on a row input link and for causing a signal representative of the logic response of a respective logic circuit coupled thereto to be provided on its associated column output link in response to a transition from a first logic state to a second logic state on the row input link to which said respective logic circuit is coupled; and second means, coupled to said first means, and responsive to a transition from said second logic state to said first logic state on a row input link, for causing the logic level of each of said column output links, the logic circuits associated with which have their row input links at said first logic state, to synchronously change state.

2. An arrangement according to claim 1, wherein said first means comprises a respective back-to-back inverter pair coupled between each logic circuit of a respective column and the column output link of that column.

3. An arrangement according to claim 1, wherein said second means comprises a plurality of switching means, each respective one of which is coupled between said first means and a reference potential terminal associated with said first logic state, and logic state transition detection means, coupled to each of said row input links, for synchronously rendering each said switching means conductive in response to a transition said second logic state to said first logic state on a row input link.

4. An arrangement according to claim 3, wherein said first means comprises a respective back-to-back inverter pair coupled between each logic circuit of a respective column and the column output link of that column.

5. An arrangement according to claim 4, wherein each of said logic circuits comprises a transistor having an input electrode, an output electrode, and a control electrode, said input electrode being coupled to a reference potential terminal associated with said second logic state, said control electrode being coupled to a row input link and said output electrode being coupled, via an element the conductivity of which is programmable, to a column output link.

6. An arrangement according to claim 5, wherein each of said switching means comprises a field effect transistor, the source-drain path of which is coupled in series between said first means and the reference potential terminal associated with said first logic state, and the gate electrode of which is coupled to said logic state transistion detection means.

7. For use with a programmable logic device containing a plurality of programmable logic circuits arranged in N rows and M columns of a matrix, the logic response of each programmable logic circuit in an $i^{th}$ respective row being accessible by an input signal coupled to an $i^{th}$ input link to which each programmable logic circuit of said respective $i^{th}$ row is coupled, said logic response being coupled to a $j^{th}$ column output link to which the respective logic cirucit is coupled, an arrangement for controlling the operation of said logic device comprising:

a plurality M of first means, each respective one of which is coupled to the N logic devices and the column output link of a respective $j^{th}$ column of said matrix, for maintaining the logic state of said column output link in the absence of a logic state transition on any of said N row input links, and for asynchronously causing a signal representative of the logic response of a respective logic circuit coupled thereto to be provided on said $j^{th}$ column output link in response to a first prescribed logic state transition from a first logic level to a second logic level on the row input link to which said respective logic circuit is coupled; and second means, coupled to said first means, and responsive to a second prescribed logic state transition from said second logic level to said first logic level on a row input link, for causing the logic level of each of said M column output links, the logic circuits associated with which have their row input links at said first logic state, to synchronously change state.

8. An arrangement according to claim 7, wherein each first means comprises a respective back-to-back inverter pair coupled between each logic circuit of a respective column and the column output link of that column.

9. An arrangement according to claim 7, wherein said second means comprises a plurality of M switching means, each respective one of which is coupled between a respective first means and a reference potential terminal associated with said first logic level, and logic state transition detection means, coupled to each of said row input links, for synchronously rendering each said switching means conductive in response to said second prescribed logic state transition on a row input link.

10. An arrangement according to claim 9, wherein each first means comprises a respective back-to-back inverter pair coupled between each logic circuit of a respective column and the column output link of that column.

11. An arrangement according to claim 5, wherein each of said logic circuits comprises a transistor having an input electrode, an output electrode, and a control electrode, said input electrode being coupled to a reference potential terminal associated with said second logic level, said control electrode being coupled to a row input link and said output electrode being coupled, via an element the conductivity of which is programmable, to a column output link.

12. An arrangement according to claim 11, wherein each of said switching means comprises a field effect transistor, the source-drain path of which is coupled in series between said first means and the reference potential terminal associated with said first logic level, and the gate electrode of which is coupled to said logic state transition detection means.

* * * * *